(12) United States Patent
Enicks et al.

(10) Patent No.: US 10,026,911 B2
(45) Date of Patent: Jul. 17, 2018

(54) STRUCTURE FOR TRANSISTOR SWITCHING SPEED IMPROVEMENT UTILIZING POLAR ELASTOMERS

(71) Applicant: Corning Incorporated, Corning, NY (US)

(72) Inventors: Darwin Gene Enicks, O'Fallon, MO (US); Mingqian He, Horseheads, NY (US); Robert George Manley, Vestal, NY (US)

(73) Assignee: Corning Incorporated, Corning, NY (US)

( * ) Notice: Subject to any disclaimer, the term of this patent is extended or adjusted under 35 U.S.C. 154(b) by 14 days.

(21) Appl. No.: 15/404,714

(22) Filed: Jan. 12, 2017

(65) Prior Publication Data

US 2017/0207403 A1    Jul. 20, 2017

Related U.S. Application Data

(60) Provisional application No. 62/279,359, filed on Jan. 15, 2016.

(51) Int. Cl.
*H01L 29/08* (2006.01)
*H01L 35/24* (2006.01)
(Continued)

(52) U.S. Cl.
CPC ........ *H01L 51/052* (2013.01); *H01L 29/1606* (2013.01); *H01L 29/4908* (2013.01);
(Continued)

(58) Field of Classification Search
CPC ............... H01L 51/052; H01L 29/4908; H01L 29/1606; H01L 51/0554; H01L 51/0047;
(Continued)

(56) References Cited

U.S. PATENT DOCUMENTS 5,210,045 A    5/1993  Possin et al.
7,265,003 B2    9/2007  Hoffman et al.
(Continued)

FOREIGN PATENT DOCUMENTS

CN    101257092 A    9/2008
CN    101393966 A    3/2009
(Continued)

OTHER PUBLICATIONS

International Search Report and Written Opinion PCT/US2017/013474 dated Mar. 10, 2017.
(Continued)

*Primary Examiner* — Victor A Mandala (57) ABSTRACT

An organic thin film transistor comprising a first gate, a second gate, a semiconducting layer located between the first gate and second gate and configured to operate as a channel and a source electrode and a drain electrode connected to opposing sides of the semiconductor layer. The organic thin film transistor also comprises a first dielectric layer located between the first gate and the semiconducting layer in a direction of current flow through the semiconductor layer, the first dielectric layer comprising a polar elastomeric dielectric material that exhibits a double layer charging effect when a set voltage is applied to the first gate and a second dielectric layer located between the second gate and the semiconducting layer.

20 Claims, 7 Drawing Sheets

(51) Int. Cl.
*H01L 51/00* (2006.01)
*H01L 51/05* (2006.01)
*H01L 29/16* (2006.01)
*H01L 29/49* (2006.01)
*H03K 17/041* (2006.01)

(52) U.S. Cl.
CPC ... H01L 51/0554 (2013.01); H03K 17/04106 (2013.01); *H01L 51/004* (2013.01); *H01L 51/0036* (2013.01); *H01L 51/0043* (2013.01); *H01L 51/0047* (2013.01); *H01L 51/0558* (2013.01)

(58) Field of Classification Search
CPC ............ H01L 51/0043; H01L 51/0036; H01L 51/004; H01L 51/0558; H03K 17/04106
See application file for complete search history.

(56) References Cited

U.S. PATENT DOCUMENTS

| | | | |
|---|---|---|---|
| 7,608,855 | B2 | 10/2009 | Lyons |
| 8,003,729 | B2 | 8/2011 | Kim et al. |
| 8,030,644 | B2 | 10/2011 | Shin et al. |
| 2007/0108068 | A1* | 5/2007 | Suh .................. B82Y 30/00 205/766 |
| 2008/0157069 | A1 | 7/2008 | Heo et al. |
| 2011/0147723 | A1 | 6/2011 | Hodges, Jr. et al. |
| 2011/0215314 | A1 | 9/2011 | De Leeuw et al. |
| 2014/0070205 | A1* | 3/2014 | Yahagi ................ C08F 12/22 257/40 |
| 2014/0124742 | A1 | 5/2014 | Ng et al. |
| 2014/0299852 | A1* | 10/2014 | Hong ................ H01L 27/3274 257/40 |
| 2014/0319452 | A1 | 10/2014 | Seabaugh et al. |
| 2016/0141530 | A1* | 5/2016 | Suga ................ H01L 51/0529 257/66 |
| 2017/0098791 | A1* | 4/2017 | Bao ................ H01L 51/0516 |
| 2017/0149001 | A1* | 5/2017 | Kleemann ............ H01L 51/057 |

FOREIGN PATENT DOCUMENTS

| | | |
|---|---|---|
| JP | 2013201295 A | 10/2013 |
| WO | 2014003388 A1 | 1/2014 |

OTHER PUBLICATIONS

Senanayak et al "Strategies for Fast-Switching in All-Plymer Field Effect Transistors" Adv. Fund. Mater. 2014, 24, 3324-3331.

Wang et al "Significance of Double-Layer Capacitor Effect in Polar Rubbery Dielectrics and Exceptionally Stable Low-Voltage High Transconductance Organic Transistors," 2015, in draft.

Braga et al "High Performance Organic Field Effect Transistors," 2015, in draf.

* cited by examiner

STRUCTURE FOR TRANSISTOR SWITCHING SPEED IMPROVEMENT UTILIZING POLAR ELASTOMERS

This application claims the benefit of priority under 35 U.S.C. § 119 of U.S. Provisional Application Ser. No. 62/279,359 filed on Jan. 15, 2016, the content of which is relied upon and incorporated herein by reference in its entirety.

FIELD

Embodiments of the disclosure relate to thin film transistors and more particularly to thin film transistors having an organic dielectric layer.

BACKGROUND

Thin-film transistors (TFTs) are conventionally made by depositing thin films of an active semiconductor layer, a dielectric layer and metallic or conductive contacts over a supporting (but non-conducting) substrate, e.g. silicon, glass, and plastics. These TFTs may act as the "engine" to drive displays, such as liquid crystal displays (LCDs). TFTs can be embedded within the display panel, for example to reduce crosstalk between pixels, improve image stability, and achieve desired video speeds.

Conventional TFTs are constructed with inorganic semiconducting materials to form the channel. These materials have an electron mobility of a-Si<indium gallium zinc oxide (IGZO)<p-Si. The inorganic materials work well in a static state. However, when used in a switching state for simple electronic or display applications at reasonable speeds, the performance is poor.

On the other hand, organic semiconducting materials have emerged which may be used in the fabrication of TFTs. Advantages of organic thin film transistors (OTFTs), such as organic field effect transistors (OFETs), may include elasticity, low temperature processing, and/or chemical stability. These characteristics result in product flexibility, novel processes, and novel substrates. However, OTFTs present some challenges such as low electron mobility or hole mobility. Mobility depends upon the contact resistance, interlayer structure, and process method.

SUMMARY

Various embodiments of the disclosure relate to an organic thin film transistor comprising a first gate, a second gate, a semiconducting layer located between the first gate and second gate and configured to operate as a channel and a source electrode and a drain electrode connected to opposing sides of the semiconductor layer. In various embodiments, the organic thin film transistor also comprises a first dielectric layer located between the first gate and the semiconducting layer in a direction of current flow through the semiconductor layer. In further embodiments, the first dielectric layer comprises a polar elastomeric dielectric material that exhibits a double layer charging effect when a set voltage is applied to the first gate and a second dielectric layer located between the second gate and the semiconducting layer.

Further embodiments of the disclosure relate to a method of making an organic thin film transistor comprising forming a first gate on a substrate, forming a first dielectric layer on the first gate, forming a semiconducting layer configured to operate as a channel on the first dielectric layer, forming a second dielectric layer on the semiconducting layer and forming a second gate on the second dielectric layer. In various embodiments, one of the first and second dielectric layers may comprise a polar elastomeric dielectric material and the first and second gates may be configured to receive different ones of a set current and a gate current.

BRIEF DESCRIPTION OF THE DRAWINGS

V, $V_G$=10 V to −10 V. The cut-off frequency ($f_c$) was estimated as the intersection of $I_{DS}$ and $I_G$.

DETAILED DESCRIPTION

Various embodiments of the disclosure relate to organic thin film transistors comprising a first gate, a second gate, and a channel comprised of an organic semiconducting layer located between the first gate and second gate. Further embodiments of the disclosure relate to methods of making organic thin film transistors.

According to at least certain embodiments of the disclosure, methods described herein may increase the free carrier concentration and thereby facilitate higher overall current drive (transconductance) of TFTs. For example, in various embodiments, methods and devices are provided in which a novel dielectric layer are provided. The novel dielectric layer and the design of the TFT may, in at least certain embodiments, overcome low mobility and/or increase transconductance in organic semiconductors or inorganic semiconductor materials. The inventors have unexpectedly discovered that superior organic semiconductor (OSC) thin film transistors may be achieved with the use of a polar elastomeric dielectric and a TFT design that takes advantage of the properties of the polar elastomeric dielectric, specifically a gate induced dipole alignment mechanism.

Both high gain and high transconductance at low operating voltages may be desirable for practical applications of organic field-effect transistors (OFETs). A double-layer capacitance effect in polar elastomeric dielectrics is discussed below. This effect may be present even when the dielectric has a low ion concentration and conductivity. Further, this effect was found to enhance the OFET transconductance when driven at low voltages. Specifically, when a polar elastomer, such as poly(vinylidene fluoride-co-hexafluoropropylene) (e-PVDF-HFP), is used as the dielectric layer, even with a thickness of several micrometers, a transconductance per channel width may be obtained that may be 30 times higher than that measured for the same organic semiconductors fabricated on a semicrystalline PVDF-HFP with a similar thickness. Without intending to be bound to a particular theory, these results may be the result of a double-layer capacitance effect. These results are achievable even with an ionic conductivity as low as $10^{-11}$ S/cm.

Field-effect transistors (FETs) with both high gain and transconductance are advantageous for a broad range of applications, including logic circuits, display drivers and sensing. High-performance FETs based on organic materials are of particular interest due to their compatibility with low-cost, high-throughput processing and mechanical compliance with soft tissues. However, it has been challenging to realize high transconductance with organic materials due to their relatively low charge carrier mobilities. One method to improve transconductance is to develop dielectric layers with high capacitances. For example, an ultrathin self-assembled monolayer (SAM) dielectric layer may be used to achieve a high capacitance of 0.7 μF/cm² and a transconductance of 0.01-0.04 S/m in vacuum evaporated OTFTs. Ion-doped polymer electrolytes and ion gels may be used as the dielectric layers for the OFETs. The capacitances are high due to a double-layer capacitor effect. The OFETs made with these materials may reach transconductances up to 0.5 S/m. However, challenges remain in using these systems for practical applications due to the low yield of SAM fabrication, incompatibility of liquid/gel materials with standard manufacturing processes, and the high moisture sensitivity of ionic dielectrics.

As discussed in more detail below, a gate induced dipole alignment (GIDA) mechanism may be used to boost output current of OFETs including an elastic fluorinated polymer dielectric material. The GIDA mechanism can significantly increase the OFET output current at low operating voltages, even with a thick dielectric layer. Various embodiments provide OFETs that may be used in a wide range of applications for printable and wearable electronics, which use only modest switching speeds. In other embodiments, the GIDA mechanism may also be used in high-performance OFET devices. Moreover, the mechanism is applicable for other polar elastic dielectric materials.

Even with a low ion concentration and ion conductivity, the double-layer capacitance effect in polar rubbery dielectrics significantly increases the transconductance. For example, when the polar elastomeric poly(vinylidene fluoride-co-hexafluoropropylene) (e-PVDF-HFP) is used as the dielectric layer, a transconductance per channel width may be 20-40 times higher, such as 25-35 times higher, such as 30 times higher, than that measured for the same organic semiconductors fabricated on a semicrystalline PVDF-HFP with a similar thickness. This effect is seen, even when the dielectric layer has a thickness of several micrometers.

Conventionally, a FET including an e-PVDF-HFP dielectric was not capable of performing a fast switching operation, i.e. switching at a frequency higher than 20 Hz. The effective electron mobility was typically severely degraded at gate switching frequencies >20 Hz, due to a double layer ion dielectric effect. This speed is slow for a switching speed. However, by using a double layer ion enabled mechanism dielectric layer in devices with the geometric configurations disclosed below, high effective mobility can be realized along with faster switching speeds, i.e. >20 Hz. Embodiments may include FETs with organic semiconducting channel materials. Other embodiments may include silicon, germanium, and silicon-germanium semiconductor channel materials.

Features of the polymer dielectric layer described herein may, according to at least some embodiments, include: mobility that is independent of thickness of dielectric layer, ease of fabrication in a large area and a very low driving voltage. Additional features may include, in various embodiments: the fluoride dielectric provides extremely stable device performance, devices can be fabricated on different substrates such as, display glass, ion contained glass, metal thin films and plastic materials and the use of a lower frequency (e.g. near quasi-static) results in higher capacitance. Other features may include, in various embodiments: no voltage dependence on capacitance; utilization of elastomer dielectric e-PVDF-HFP; and the ability to improve slow response times. It should be noted, however, that in various embodiments, one or more of the above features may not be present, and in at least certain embodiments, none of the above features may be present, yet such embodiments are intended to be within the scope of the disclosure.

Additionally, certain embodiments disclosed herein may allow the implementation of mediocre semiconductor materials that are easy to process in high performance circuitry. Additionally, the devices disclosed herein may, in various embodiments, be compatible with current manufacturing infrastructure. Example uses include battery-less displays for transport cards and smart cards, electronic shelf labels, embedded luggage tags, smart watch and large flexible OLED applications.

Figure 1:
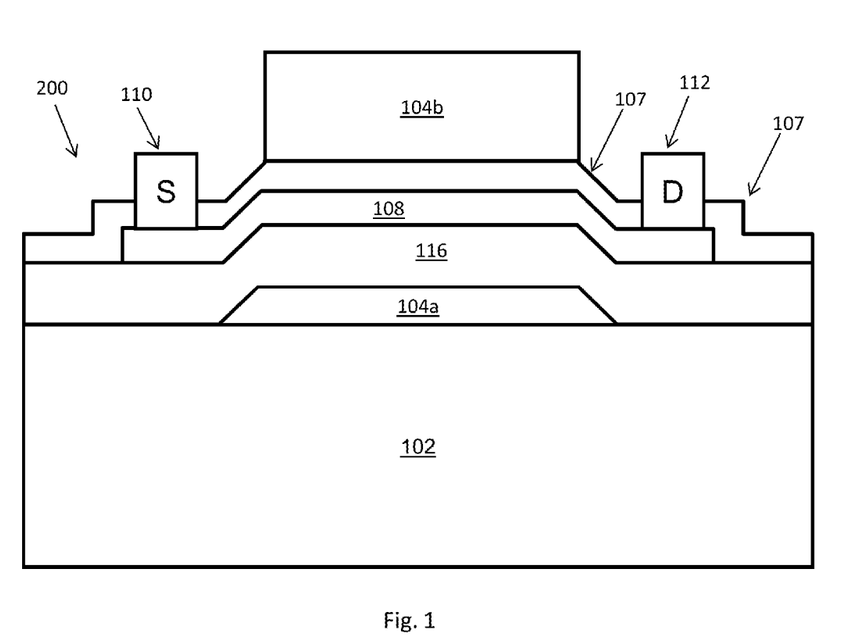
FIG. 1 is a side schematic illustration of a FET according to an embodiment of the disclosure.

FIG. 1 illustrates a FET 200 according to various embodiments of the present disclosure. The FET 200 includes a substrate 102 which may be made of an insulating material or a conducting or semiconducting material with an insulating layer (not shown) on top of the conducting or semiconducting material. Located on top of the substrate 102 is a first gate 104a. The first gate 104a may be configured to receive a set voltage. In this case, the first gate 104a may be referred to as a set gate. A first dielectric layer 116 is located on top of the substrate 102 and covers the first gate 104a. As discussed in more detail below, the first dielectric layer 116 may include a polar elastomeric dielectric material that forms dipoles with the application of an electric field. In some embodiments, the polar elastomeric dielectric material may be an elastomeric poly(vinylidene fluoride-co-hexafluoropropylene (e-PVDF-HFP) material.

A semiconducting layer 108 is located on top of the first dielectric layer 116. The semiconducting layer 108 may be formed of an organic semiconductor material or an inorganic semiconductor material. Herein, the semiconductor layer 108 may also be referred to as a channel. The FET 200 may also include a second dielectric layer 107 located above the semiconducting layer 108 and a second gate 104b located above the second dielectric layer 107. The second gate 104b may be configured to receive a signal voltage (e.g., a data voltage). In this case, the second gate 104b may be referred to as a signal gate. The second dielectric layer 107, may be made of any suitable dielectric material, such as poly (methyl-methacrylate) (PMMA) or the like. The FET 200 includes a source electrode 110 and a drain electrode 112 that are electrically connected to the semiconducting layer 108.

In some embodiments, the first dielectric layer 116 may be thicker than the second dielectric layer 107. However, in other embodiments the first dielectric layer 116 and the second dielectric layer 107 have substantially the same thickness. Alternatively, the first layer 116 may be thinner than the second dielectric layer 107. The source and drain electrodes 110, 112, may be on top of or below the semiconducting layer 108. In some embodiments, the set gate 104a is the same length or longer than the signal gate 104b, with respect to a current flow direction through the semiconductor layer 108. This configuration may provide superior transconductance (voltage applied to the signal gate 104b resulting in increased current flow between the source and drain electrodes 110, 112).

In the alternative, the above configuration may be inverted (e.g., a bottom gate configuration). For example, the second dielectric layer 107 may be made of a polar elastomeric dielectric material, the second gate 104B may be a set gate configured to receive a set voltage, the first dielectric layer 116 may be formed of conventional dielectric material, and the first gate 104a may be a signal gate configured to receive a signal voltage.

Figure 2:
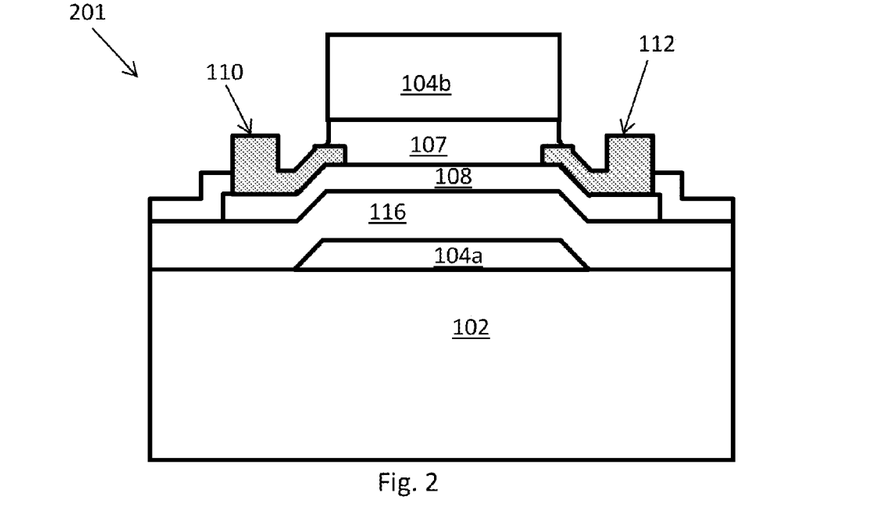
FIG. 2 is a side schematic illustration of a FET according to another embodiment of the disclosure.

FIG. 2 illustrates a FET 201 according to various embodiments of the present disclosure. The FET 201 is similar to the FET 200, so only the differences therebetween will be described in detail. In particular, the source electrode 110 and the drain electrode 112 may be fabricated such that portions thereof extend between the semiconductor layer 108 and the second dielectric layer 107. The source and drain electrodes 110, 112 may also overlap with the set gate 104a and the signal gate 104b. The larger source/drain metallization scheme of the source and drain electrodes 110, 112 (e.g., the extended portions thereof) increases the effective mobility and hence, the transconductance of the semiconductor layer 108, but may reduce an overall switching speed, due to parasitic coupling with the set and signal gates 104a, 104b and the source and drain electrodes 110, 112. This electrode configuration may also be applied to bottom gate FET configurations.

Figure 3:
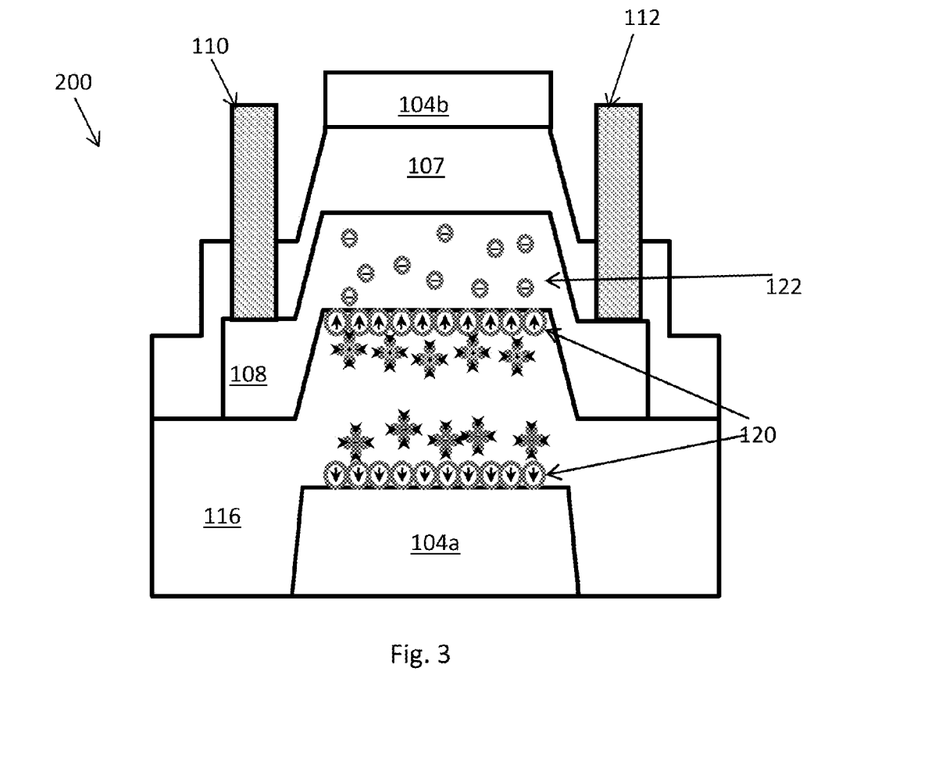
FIG. 3 is a side schematic illustration showing the mechanism for inducing Helmholtz planes in a polymer dielectric according to an embodiment of the disclosure.

FIG. 3 illustrates how the set gate 104a induces Helmholtz planes 120 in the first dielectric layer 116. The Helmholtz planes 120, in turn, create electric fields at an interface between the first dielectric layer 116 and the semiconductor layer 108, and at an interface between the first dielectric layer 116 and the set gate 104A, as indicated by the arrows in the Helmholtz planes 120. The arrows represent a monolayer interaction. The distance over the electric field is essentially one atom thick. As a result, an intense electric field is created that induces free carriers 122 in the semiconducting layer 108. As discussed in more detail below, the free carriers 122 set the state ("on" or "off") of the semiconducting layer 108.

To operate a FET 200 according to any of the embodiments above, a relatively low set voltage, such as a voltage of about 0.5-4V, or about 1-2V, may be applied to the set gate 104a. The set voltage may be applied at a near constant or low frequency. The set voltage induces a weak inversion state in the semiconducting layer 108 (i.e. free carriers 122 are induced). A gate signal applied to the first gate 104b may be easily amplified, as the free carrier concentration in the semiconducting layer 108 is already relatively "high". The set voltage applied to the set gate 104a may result in a leakage current in the semiconductor layer 108, because the semiconducting layer 108 is in a near "on" state. While the set gate 104a is on (e.g., a set voltage is applied thereto), the semiconducting layer 108 is maintained in a weak or moderate inversion state, which may lead to higher levels of leakage current, even when a relatively low signal voltage is applied to the signal gate 104b, such as a signal voltage of about 0-3 volts.

When the time between gate signals is greater than the response time of the polymer dielectric, the set gate 104a may be turned off (e.g., no set voltage is applied thereto) or a standby voltage lower than the set voltage may be applied thereto. That is, when the frequency of the incoming gate signal is longer than the frequency response of the dielectric material, the set gate 104a may be turned off to conserve power (e.g., reduce a leakage current). For example, the set gate 104a is turned off if the signal frequency is less than 20 Hz.

In devices that include an n-type semiconductor layer 108, (i.e. a positive gate voltage is used for current conduction between the source and drain), the gate voltage ($V_{GS}$) can be set lower than 0 V (e.g., negative) to help suppress the leakage current induced by the set voltage applied to the set gate 104a. In other words, a negative overdrive voltage, such as from about −5 to −15 volts, may be applied to the signal electrode 104b, to lower the current leakage between signal voltage pulses.

Figure 4:
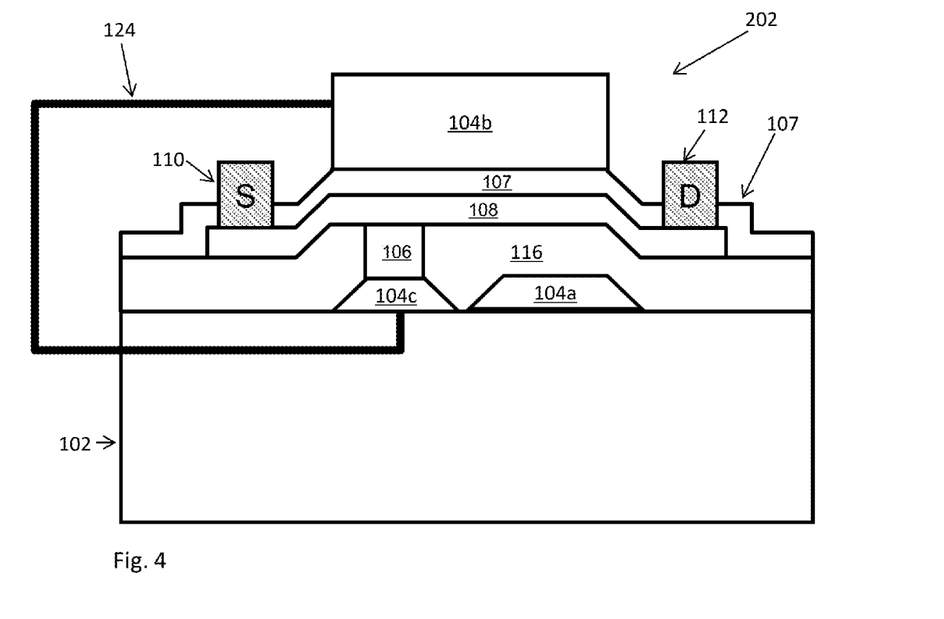
FIG. 4 is a side schematic illustration of a FET with two signal gates according to another embodiment.

FIG. 4 illustrates a tri-gate FET 202 according to various embodiments of the present disclosure. The tri-gate FET 202 is similar to the FET 200, so only the differences therebetween will be discussed in detail. The tri-gate FET 202 includes a third gate 104c, which may also be referred to as a second signal gate 104c, disposed on the substrate 102 adjacent to the set gate 104a. The second signal gate 104c may be in the same plane as the set gate 104a. The tri-gate FET 202 may also include an electrical contact 124 to electrically connect the first and second signal gates 104b, 104c. The tri-gate FET 202 may also include a third dielectric layer 109 disposed between the second set gate 104c and the semiconductor layer 108. The third dielectric layer 109 may be formed of a conventional dielectric material. The first dielectric layer 116 may include a polar elastomer as described above.

The set gate 104a may be biased (e.g., may be configured to receive a set voltage) such that the semiconducting layer 108 is put into weak or moderate inversion state. When the first and second signal gates 104b, 104c receive a signal voltage (e.g., a data voltage), current can flow between the source electrode 110 and the drain electrode 112 through the semiconductor layer 108. When no signal voltage or an over-driven voltage is applied to the first and second signal gates 104b, 104c, a current pinch off region is created between the two signal gates 104b, 104c. This reduces power consumption (e.g. current leakage) that may otherwise occur when the set voltage is applied to the set gate 104a. In this embodiment, power consumption in improved, however, the transconductance may be slightly lower than the structure illustrated in FIG. 1.

Figure 5:
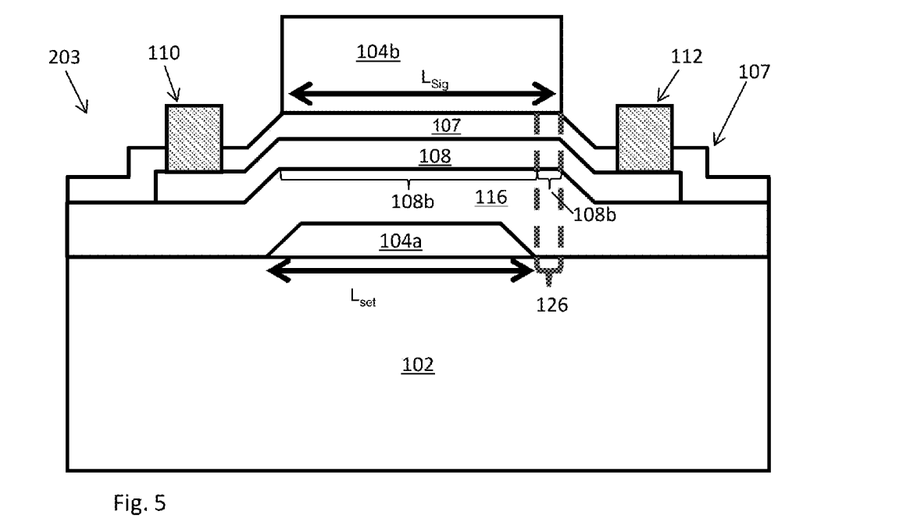
FIG. 5 is a side schematic illustration of a FET according to another embodiment of the disclosure.

FIG. 5 illustrates a FET 203, according to various embodiments of the present disclosure. The FET 203 is similar to the FET 200, so only the differences therebetween will be discussed in detail. The FET 203 includes a signal gate 104b and a set gate 104a with a conventional second dielectric layer 107 and a polymer dielectric layer 116, such as polar elastomer. In this embodiment, the signal gate 104b is larger in length $L_{Sig}$ than the length $L_{set}$ of the set gate 104a, with respect to a current flow direction between the source and drain electrodes 110, 112, creating an offset region 126. The offset region 126 may be a region where the signal gate 104b does not directly overlap with the set gate 104a. In other words, the semiconductor layer 108 may include an offset region 108a where the semiconductor layer 108 directly overlaps with only the signal gate 104b, and a conductive region 108b where the semiconductor layer 108 that overlaps with both the signal and set gates 104b, 104a. The offset region 108a may be located on the drain-side of the FET 202 (e.g., closer to the drain electrode 112 than the source electrode 110). The conductive region 108a may have a higher conductivity than the offset region 108b, since the electric field generated by the set gate 104a may have very little or no effect on the offset region 108a. As such, the offset region 108a may have a relatively high resistance and may operate to pinch off current flow (e.g., a leakage current) through the semiconductor layer 108, when the set gate 104a is on (e.g., a set voltage is applied) and the signal gate 104b is off (e.g., a signal voltage is not applied).

The design illustrated in FIG. 5 maintains the simplicity of the design illustrated in FIG. 2, but with lower current when the first signal gate 104b is off or in an over-driven off-state. The FET 202 may have reduced transconductance as compared to the FET 200. The larger signal gate 104b can be realized by geometrical layout design. It can also be realized by utilizing process bias.

Examples

As discussed above, a polar fluorinated PVDF-HFP elastomer dielectric, despite having a low ion concentration, is capable of inducing an electric double-layer charging effect under an applied gate voltage. This polymer dielectric is solution-processable with a high static capacitance of ~0.3 μF/cm², even at a thickness of several micrometers. Devices made from this thick polymer dielectric are capable of operating at low voltages with a transconductance as high as 0.02 Sm⁻¹ for polymer OTFTs and as high as 1.2 Sm⁻¹ for CVD-graphene FET. This polymer dielectric is highly compatible with solution processing of various organic semiconductors. The resulting devices show both high current output and low bias stress in both ambient and aqueous conditions.

PVDF-HFP polymers are usually semicrystalline when a high molar fraction of PVDF segments are incorporated. However, a higher molar ratio of the HFP units (45 mol % determined by ¹⁹F-NMR) results in an elastic material with a glass transition temperature ($T_g$) of around −20° C. The dielectric constant is 11 as measured at 1 kHz, a value similar to the previously reported range of 8 to 13.

Thick polymer dielectric films (1.4-5 μm) are used in the OFETs to reduce leakage current (10⁻⁶ A cm⁻² at V=−1 V for 1.4 μm). Further, thick polymer dielectric films are much more readily attainable with large-scale coating methods. The films displayed smooth surfaces (surface roughness ~0.3 nm) and a high breakdown electric field exceeding 0.3 MV/cm. The performance of the e-PVDF-HFP is stable under different preparation conditions. Different conditions of annealing are investigated, including intentionally adding deionized-water to the solution without seeing significant change in the capacitance value.

Figure 6A:
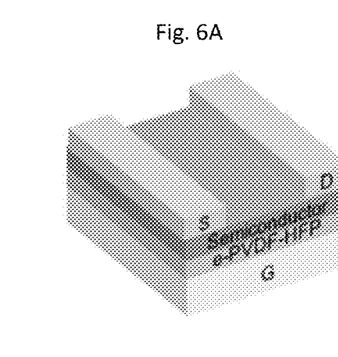
FIG. 6A is a side schematic illustration of an OFET according to an embodiment of the disclosure.
Figure 6B:
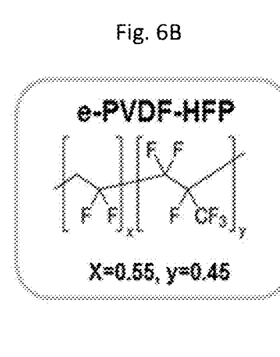
FIG. 6B illustrates the chemical structure of an e-PVDF-HFP dielectric.
Figure 6C:
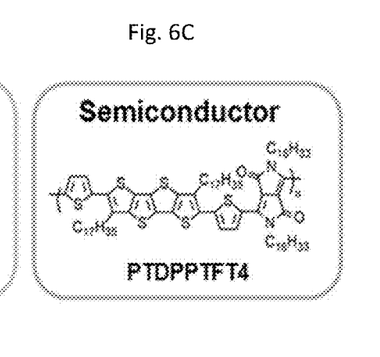
FIG. 6C illustrates the chemical structure of semiconducting compound, Poly[(2,5-dihexadecyl-2,3,5,6-tetrahydro-3,6-dioxopyrrolo[3,4-c]pyrrole-1,4-diyl)-2,5-thiophenediyl(3,7-diheptadecylthieno[3,2-1:0]thieno[2',3':4,5]thieno[2,3-d]thiophene-2,6-diyl)-2,5-thiophenediyl], CAS Reg. No. 1423065-20-6 ("PTDPPTFT4").
Figure 6D:
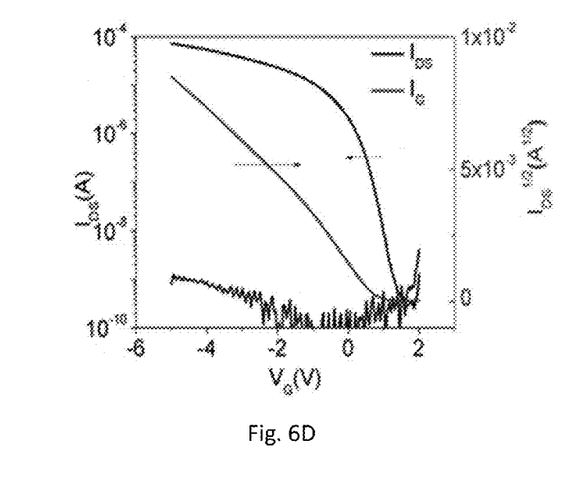
FIG. 6D is a plot of the output characteristics of PTD-PPTFT4.
Figure 6E:
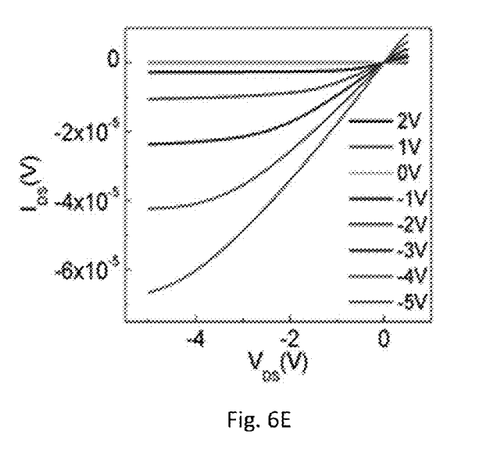
FIG. 6E is a plot of the transfer characteristics of PTD-PPTFT4.

FIG. 6A illustrates an OFET according to an exemplary embodiment. FIG. 6B illustrates the chemical structure of dielectric e-PVDF-HFP used in the OFET of FIG. 6A. To evaluate the transistor device performance using the dielectric material, the semiconducting fused thiophene diketopyrrolopyrrole compound, Poly[(2,5-dihexadecyl-2,3,5,6-tetrahydro-3,6-dioxopyrrolo[3,4-c]pyrrole-1,4-diyl)-2,5-thiophenediyl(3,7-diheptadecylthieno[3,2-b]thieno[2',3':4,5]thieno[2,3-d]thiophene-2,6-diyl)-2,5-thiophenediyl] ("PTDPPTFT4") (FIG. 6C), is chosen as the semiconductor layer due to its high charge carrier mobility. The device has a channel length L=50 μm and channel width W=1000 μm. The thickness of the dielectric is 1.4 μm. FIG. 6D is a plot of the output characteristics of PTDPPTFT4, while FIG. 6E is a plot of the transfer characteristics of PTDPPTFT4. Two slopes in the $I_{DS}^{1/2}$ vs. $V_G$ plot are observed. This may be attributed to the existence of contact resistance in the device. The first slope is used in the range of +0.2 V to −2 V to estimate mobility values. The device exhibits a high on-current of close to 10⁻⁴ A at $V_G$=−5V, despite the thick dielectric layer (1.4 μm) used, while the subthreshold slope of the device is only 120 mV decade⁻¹, comparable to the lowest values reported for OTFTs. Furthermore, the threshold voltage ($V_{TH}$) is <1 V, which is desirable in low-voltage-driven applications, and the device exhibits a high transconductance per channel width of 0.02 S m⁻¹ at a gate voltage of −3V.

OTFTs operating at low voltages have been previously achieved by using poly(vinylidene fluoride-trifluoroethylene-chlorofluoroethylene) (P(VDF-TrFE-CFE)) as the dielectric layer with a dielectric constant of up to 60 at low frequencies. However, a thin layer of ~160 nm was required to achieve the high transconductance per channel width of $4\times10^{-3}$ S m$^{-1}$ at −3 V. The values achieved with the devices disclosed herein are comparable to the best reported OTFTs with ultrathin SAM dielectrics (0.01-0.04 S/m). Further, the e-PVDF-HFP dielectric polymer is highly compatible with standard device fabrication processes and results in devices with stable operation in ambient and even under water, as discussed in more detail below.

The table below is a summary of the OFET electrical performances measured in the saturation regime using e-PVDFHFP dielectric layer (thickness 1.4 μm). The mobilities in parentheses are extracted from LCR Meter-measured capacitance (8.4 nF cm$^2$) at 20 Hz$^2$ $g_m/V_{bias}$ normalized with respect to voltage bias. For P3HT, PII2T and PTDPPTFT4 operated in the saturation regime, the value is normalized with respect to the gate voltage (3V). For graphene operated in the linear regime, the value is normalized with respect to the drain-source voltage ($V^{DS}=-0.1$ V). Mobility values are calculated in quasi-static capacitance of 300 nF cm$^{-2}$. (W: 1000 μm; L=50 μm).

To further confirm the capacitance value in the quasi-static limit, the time constant of an RC circuit is measured, based on an e-PVDF-HFP capacitor and an external resistor. No voltage-dependence of the capacitance is observed. This confirms the high capacitance at a low frequency of 0.1 Hz, which allows explicit determination of the capacitance and the corresponding mobility (FIG. 7B) from OTFT measurements. The double-layer charging effect at low frequency for e-PVDF-HFP is unexpected considering that <1 wt % of salt is present. In comparison, typical ion-gel dielectrics include >80 wt % ionic liquid and a high ion conductivity in the order of $10^{-2}$-$10^{-5}$ S/cm. The measured ion conductivity for e-PVDF-HFP is several orders of magnitude lower, in which it is measured it to be ~$8\times10^{-11}$ S/cm. In contrast, when a semicrystalline PVDF-HFP (90% of VDF by molar ratio, termed as c-PVDF-HFP) is used as a dielectric layer, the output current decreases with increasing c-PVDF-HFP thickness from 0.55 μm to 2.15 μm, as expected for conventional dielectric materials. The quasi-static capacitance through charging/discharging of an RC circuit also yields similar capacitance values to those measured at higher frequencies (>20 Hz).

| Sample | Mobility$^{MAX}$ (cm$_2$V$^{-1}$s$^{-1}$) | Mobility$^{ave}$ (cm$^2$V$^{-1}$s$^{-1}$) | on/off$^{ave}$ | $V_t^{ave}$ (V) | $g_m^{ave}$ (μS) | $g_m^{ave}/W$ (S/m) | $g_m^{avg}/V^{bias}$, (μS/V)$^2$ |
|---|---|---|---|---|---|---|---|
| P3HT | 0.14 (4.86) | 0.09 ± 0.05 (3.21 ± 1.64) | 4 × 10$^3$ | 0.01 ± 0.59 | 3.48 | 3.48 × 10$^{-3}$ | 1.16 |
| PII2T | 0.19 (7.35) | 0.17 ± 0.02 (3.52 ± 1.78) | 8 × 10$^3$ | −0.55 ± 0.08 | 3.42 | 3.42 × 10$^{-3}$ | 1.14 |
| PTDPPTFT4 | 2.11 (75.71) | 1.09 ± 0.44 (38.98 ± 15.77) | 2 × 10$^4$ | −0.67 ± 0.31 | 26.4 | 26.4 × 10$^{-3}$ | 8.8 |
| Graphene | 2181 (7.11 × 10$^4$) | 1.32 ± 0.99 × 10$^3$ (3.95 ± 2.97) × 10$^4$ | 6 | 1.08 ± 0.56 | 1200 | 1.2 | 1.2 × 10$^4$ |
| PCBM | 0.03 (1.07) | 0.02 ± 0.003 (0.82 ± 0.16) | 6 × 10$^3$ | −2.1 ± 0.4 | 0.54 | 5.4 × 10$^{-4}$ | 0.18 |

Even though high transconductance at a low voltage is desirable for practical applications, charge carrier mobility is typically used to characterize the charge transport ability of a semiconductor. The charge carrier mobility can be calculated from the standard MOSFET models from the saturation and linear regimes and is dependent on the capacitance value used for the calculation. Non-ionic dielectric materials exhibit relatively constant capacitances regardless of the measurement frequency. The capacitance of e-PVDF-HFP is also found to remain almost unchanged from 20 to 100 kHz, but it increased rapidly as the frequency is decreased to below 1 Hz. Therefore, the typical procedure widely used in literature for mobility calculation using a capacitance value measured at >20 Hz results in an overestimation of mobility. This issue is further confirmed by measuring transistors with e-PVDF-HFP of various thicknesses. Even though the capacitances measured at 20 Hz scaled with dielectric thickness as expected for standard capacitors, the transistor output current does not show the expected scaling with dielectric thickness. This suggests that the origin of the high transconductance is likely distinctive from those prepared on other PVDF-based dielectric materials primarily utilizing their high polarizability. The capacitance is also measured in the quasi-static limit. A sharp rise in the capacitance value is observed at low frequencies approaching the quasi-static limit. Furthermore, the capacitance shows little change as a function of the thickness of the dielectric layer, suggesting a double-layer charging effect is present in the device. The observed high capacitance also explains the high transconductance obtained even at low operating voltage.

The above observations suggest that the unusual double-layer charging effect in the e-PVDF-HFP is related to its low glass transition temperature $T_g$ (~−20° C.). Elastic polymers are desirable matrixes for ion conductors due to the high segmental motion that facilitates ion transport. Furthermore, the high concentration of polar groups in e-PVDF-HFP may solvate salt impurities, such as crosslinking reagents (typically phosphonium compounds). In the case of c-PVDF-HFP, no clear evidence of ion contribution to the charging process has been identified because of the suppressed segmental motion due to its semicrystalline nature. Poly(dimethylsiloxane) (PDMS) is a known elastic dielectric material. However, it does not exhibit signatures of electric double-layer charging due its low polarity. Therefore, e-PVDF-HFP is a rare dielectric material that exhibits the double-layer charging effect of ionic dielectrics, while also maintaining the processing characteristics and stability of non-ionic dielectrics.

Figure 7A:
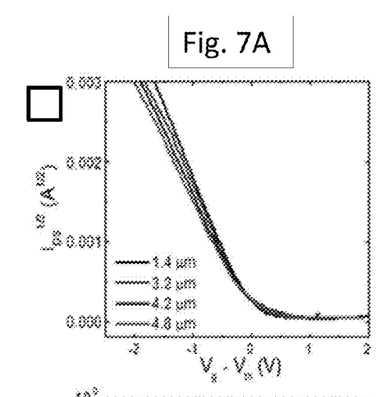
FIG. 7A a plot illustrating transfer curves of OTFTs prepared on e-PVDF-HFP dielectric layer with varying thicknesses.
Figure 7B:
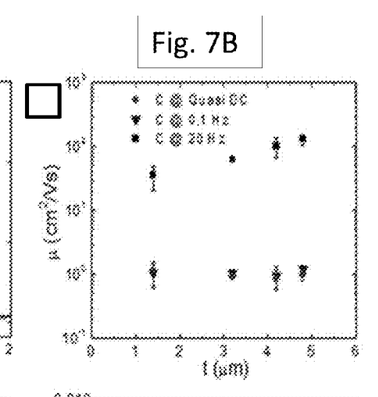
FIG. 7B a plot illustrating the corresponding field-effect mobility as a function of the thickness of e-PVDF-HFP determined by using capacitance at 20 Hz, 0.1 Hz and quasi-DC values of the OTFTs of FIG. 7A.
Figure 7C:
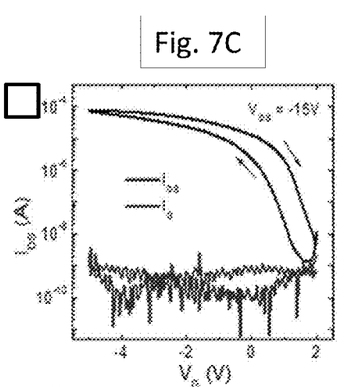
FIG. 7C is a plot illustrating the device characteristics of the OTFTs of FIG. 7A in forward and reverse sweep.
Figure 7D:
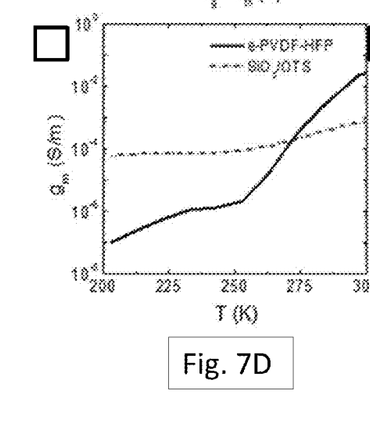
FIG. 7D is a plot illustrating the temperature-dependent transconductance of PTDPPTFT4 FETs made on e-PVDF-HFP (solid trace) and OTS-modified $SiO_2$ (dotted trace).
Figure 7E:
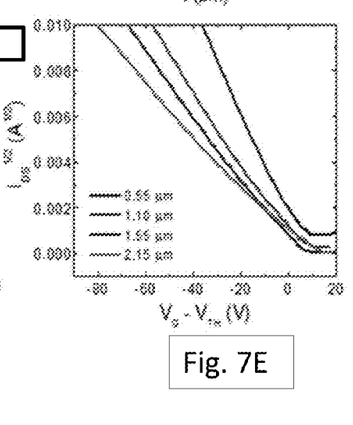
FIG. 7E is a plot illustrating the transfer curves of OTFTs prepared on c-PVDF-HFP dielectric layer with varying thicknesses.
Figure 7F:
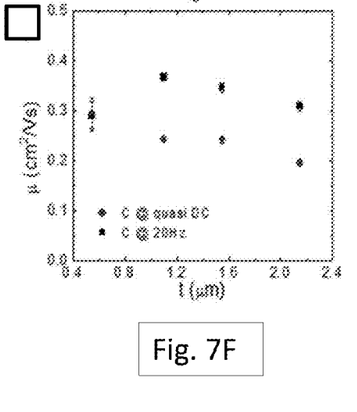
FIG. 7F is a plot illustrating the corresponding field-effect mobility as a function of the thickness of c-PVDF-HFP determined by using capacitance at 20 Hz and quasi-DC values of the OTFTs of FIG. 7E.

FIGS. 7A-7F are plots illustrating the device characteristics of PTDPPTFT4 transistors fabricated on e-PVDF-HFP and c-PVDF-HFP. FIG. 7A illustrates transfer curves of OTFTs prepared on e-PVDF-HFP dielectric layer with varying thicknesses. FIG. 7B illustrates the corresponding field-effect mobility as a function of the thickness of e-PVDF-HFP determined by using capacitance at 20 Hz, 0.1 Hz and quasi-DC values. The adoption of capacitance at 20 Hz gives rise to underestimation of the actual charge carrier density during transfer characteristic measurements and therefore inflated mobility values. FIG. 7C shows device characteristics in forward and reverse sweep. FIG. 7D presents the temperature-dependent transconductance of PTDPPTFT4 FETs made on e-PVDF-HFP (solid trace) and OTS-modified $SiO_2$ (dotted trace). FIG. 7E illustrates transfer curves of OTFTs prepared on c-PVDF-HFP dielectric layer with varying thicknesses. FIG. 8F charts the corresponding field-effect mobility as a function of the thickness of c-PVDF-HFP determined by using capacitance at 20 Hz and quasi-DC values.

Figure 8A:
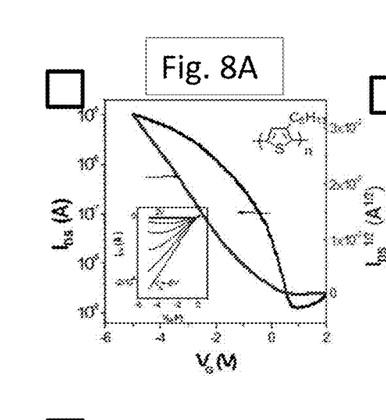
FIG. 8A is a plot the transfer and output characteristics of OTFTs with a P3HT semiconducting layer and an e-PVDF-HFP dielectric layer with W/L=20.
Figure 8B:
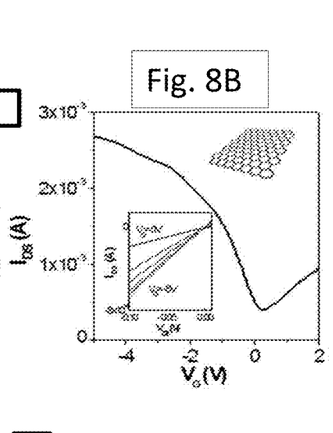
FIG. 8B is a plot the transfer and output characteristics of OTFTs with a graphene semiconducting layer and an e-PVDF-HFP dielectric layer with W/L=20.
Figure 8C:
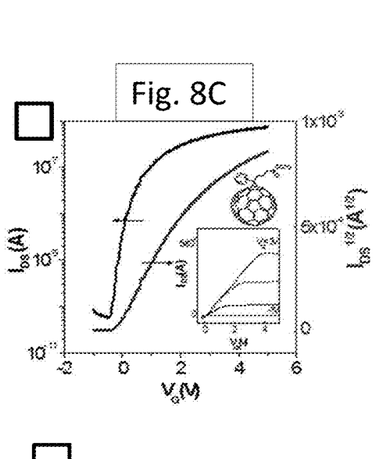
FIG. 8C is a plot the transfer and output characteristics of OTFTs with a PCBM semiconducting layer and an e-PVDF-HFP dielectric layer with W/L=20.

The combination of the fluorinated polar elastomer with a low concentration of ions in e-PVDF-HFP dielectric gated OTFTs induces a high charge carrier density through electric double-layer charging. Furthermore, all the studied transistors show a small hysteresis of ~0.5 V, with a higher back-sweep current compared to the forward sweep as shown in FIG. 8C. The performance of the device depends on the operating temperature, showing a sharp decrease in the transconductance by cooling the device from room temperature to 200 K (FIG. 7D). This decrease is largely attributed to the reduced ion mobility, which directly correlates with the segmental motion and depends strongly on temperature.

Figure 8D:
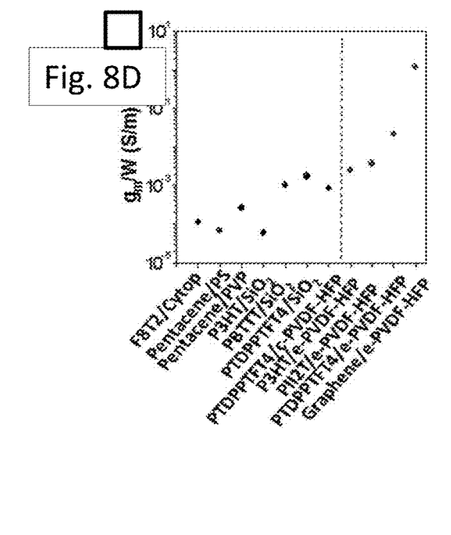
FIG. 8D is a plot illustrating the transconductance comparison between various dielectrics.

Several additional well-known solution processable organic semiconductors and CVD-graphene are tested on the thick e-PVDF-HFP dielectric. As shown in FIG. 8D, both p- and re-channel transistors exhibited high transconductance. All the devices generate large current outputs at low gate voltages of less than 5V. The transconductances per channel width of these devices are measured to be three to ten times higher than the values of the corresponding material with $SiO_2$ or other commonly reported polymer dielectrics. The CVD-graphene device shows a transconductance as high as 1.2 mS ($V_{DS}$=−0.1 V), and it is even higher than CVD-graphene devices using phosphate-buffered electrolyte with NaCl as a dielectric layer (0.42 mS). By normalizing $V_{DS}$ for comparison purposes, the normalized transconductance ($g_m/V_D$) of the graphene device (12000 $\mu SV^{-1}$) is higher than those of the graphene devices made on high-dielectric-constant $HfO_2$ or $Y_2O_3$ dielectrics (~100 $\mu SV^{-1}$).

Figure 8E:
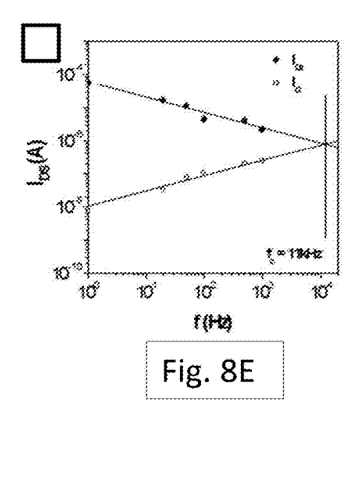
FIG. 8E is a plot illustrating the $I_{DS}$ and $I_G$ currents versus frequency of a PTDPPTFT4 transistor with e-PVDF-HFP as a dielectric layer (L=50 μm, W=1000 μm), where $V_{DS}$=−15
Figure 8F:
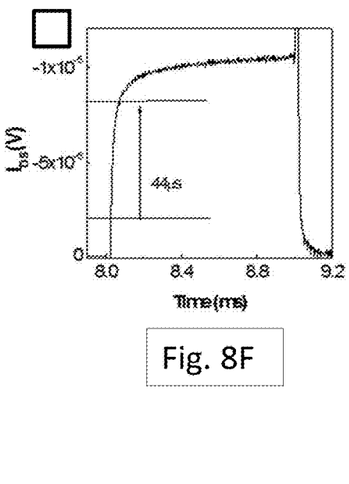
FIG. 8F is a plot illustrating the $I_{DS}$ response of PTDPPTFT4 to a square wave function gate-voltage pulse at 1 kHz, pulse width=1 ms, pulse rise time=4 μs, and channel length=50 μm.

FIGS. 8A-8F are plots illustrating the electrical characteristics of OTFTs based on e-PVDF-HFP dielectric layer with W/L=20 including the transfer and output characteristics of OTFTs of P3HT (FIG. 8A), graphene (FIG. 8B), and PCBM (FIG. 8C). Note that the transfer characteristics of the graphene devices are evaluated in the linear-regime, where VDS=−0.1 V. Each panel exhibits the transfer curves with output characteristics shown in the inserted small figures. FIG. 8D illustrates the transconductance comparison between various dielectrics. The black dots show the transconductance obtained from OFETs based on common dielectric layers, including cross-linked Cytop (d=50-70 nm), cross-linked polystyrene (PS) (d=10 nm), cross-linked poly(vinyl phenyl) (PVP) (thickness=280 nm), $SiO_2$ (d=230-300 nm) and semicrystalline PVDF-HFP (thickness=1.4 μm). All the $SiO_2$ dielectrics are modified by OTS SAMs. The red dots represent the performance obtained from OFETs based on e-PVDF-HFP. The transconductances of all the e-PVDF-HFP devices are around one order of magnitude higher than the corresponding devices made on OTS-modified $SiO_2$. FIG. 8E illustrates $I_{DS}$ and $I_G$ currents versus frequency of a PTDPPTFT4 transistor with e-PVDF-HFP as a dielectric layer (L=50 μm, W=1000 μm), where $V_{DS}$=−15 V, $V_G$=10 V to −10 V. The cut-off frequency ($f_c$) is estimated as the intersection of $I_{DS}$ and $I_G$. FIG. 8F plots the $I_{DS}$ response of PTDPPTFT4 to a square wave function gate-voltage pulse at 1 kHz, pulse width=1 ms, pulse rise time=4 μs, and channel length=50 μm. The response time is defined as the time required to reach 80% of the maximum ON-current from 20% OFF.

Slow response time is a potential concern for ionic dielectric gated field-effect transistors. For practical applications, such as radio frequency identification (RFID) and organic light-emitting diodes (OLEDs), switching speed is a desirable device parameter. The switching speed of the ionic electrolyte gated devices typically ranges between 1 to 100 Hz. A switching speed of 10 KHz can be achieved with ion gels at a very high ion concentration (9 wt % ionic liquid, 0.7 wt % polymer electrolyte and 90 wt % solvent) and high ion mobility (around $8\times10^{-3}$ S/cm). To evaluate the switching behavior of the e-PVDF-HFP OFETs, a short gate voltage pulse is applied for device operation. The e-PVDF-HFP/PTDPPTFT4 transistor exhibits a switching-on response of 44 μs (FIGS. 8E-8F). The cutoff switching frequency ($f_c$), characterizing the maximum operating frequency of a transistor, is determined to be 11 kHz by measuring the $I_{DS}$ and $I_G$ as a function of frequency. The cutoff switching frequency $f_c$ is defined as the frequency where AC modulated $I_{DS}$ is equal to the parasitic gate current ($I_G$). The $f_c$ value (11 kHz) is comparable or even higher than many polymer electrolyte devices with very high ion concentrations, despite the ultralow ion concentration in e-PVDF-HFP. The lowering of $I_{DS}$ observed at higher frequencies (FIG. 8E) is attributed to the decreased capacitance with increased frequency. In addition, the increased $I_G$ is mainly attributed to parasitic current contributed from the large overlap between the drain/source and gate electrodes. The cutoff frequency of the device is currently mainly limited by its long channel length (L=50 μm) and large overlap between drain/source and gate electrodes, which results in a large parasitic gate current. In an embodiment, the switching speed of devices is further improved by minimizing the overlap of the drain/source and gate electrodes and further modification of the dielectric material. In a complementary experiment, drain bias consisting of an AC signal superimposed to a DC voltage is applied while measuring the transfer characteristics, allowing the calculation of linear field-effect mobility. As expected, the DC-mobility of the device in DC mode does not change, while the AC-mobility only drops to about 20% and 50% at frequencies of 1 kHz and 10 kHz, respectively. These devices suitable for biosensor applications.

Figure 9A:
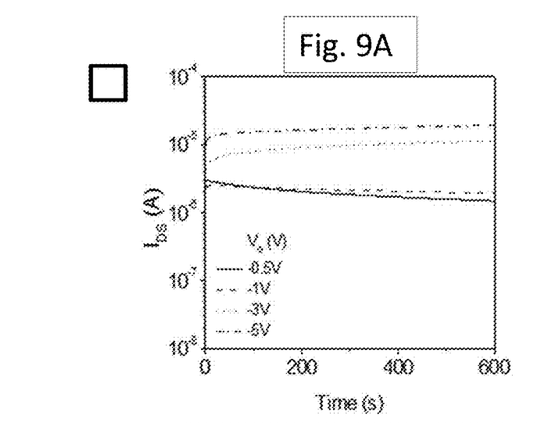
FIG. 9A is a plot illustrating the bias stress behavior ($I_{DS}$ vs. time) for the PTDPPTFT4 FETs under $V_G$=−0.5, −1, −3 and −5 V in ambient conditions according to an embodiment.
Figure 9B:
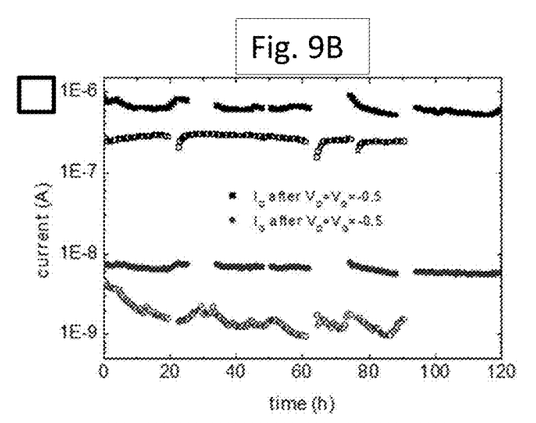
FIG. 9B is a plot illustrating the long-term bias on current $I_D$ and leakage current $I_G$ measured at the end of each bias cycle in air (solid symbols) and in DI-water (open symbols) of the FETs of FIG. 9B.
Figure 9C:
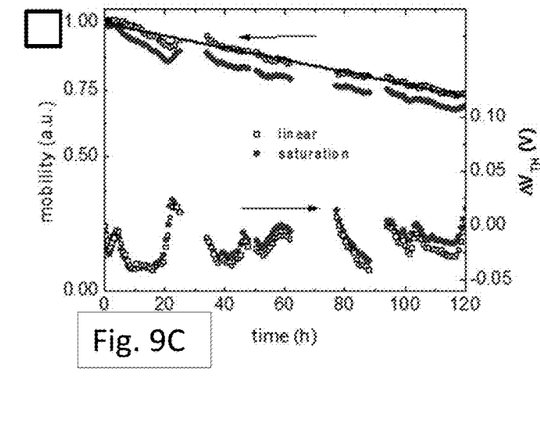
FIG. 9C is a plot illustrating the evolution of mobility and shift of threshold voltage in both the linear and saturation regimes during long-term bias in air of the FETs of FIG. 9A.
Figure 9D:
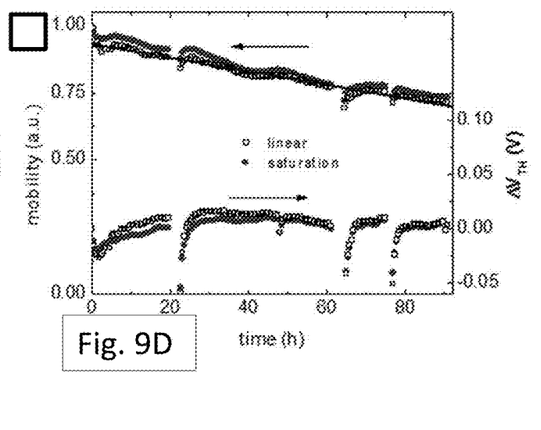
FIG. 9D is a plot illustrating the evolution of mobility and shift of threshold voltage in both the linear and saturation regimes during long-term bias in DI-water of the FETs of FIG. 9A.

FIGS. 9A-9F are plots illustrating the bias stress analysis of e-PVDF-HFP devices with PTDPPTFT4 as the semiconductor material. FIG. 9A illustrates the bias stress behavior ($I_{DS}$ vs. time) for the PTDPPTFT4 FETs under $V_G$=−0.5, −1, −3 and −5 V in ambient conditions. FIG. 9B illustrates the long-term bias on current $I_D$ and leakage current $I_G$ measured at the end of each bias cycle in air (solid symbols) and in DI-water (open symbols). A bias of $V_D$=$V_G$=−0.5 V is applied and transfer characteristics are measured before and immediately after each bias step. FIG. 9C describes the evolution of mobility and shift of threshold voltage in both the linear and saturation regimes during long-term bias in air. FIG. 9D illustrates the evolution of mobility and shift of threshold voltage in both the linear and saturation regimes during long-term bias in DI-water. The field effect mobility is calculated with the quasi-static capacitance. The decrease of mobility is analyzed by performing a linear regression in time exhibiting a slope of about −0.22%/hour and −0.25%/hour, for the device in air and DI-water, respectively. Interruptions in the plots are the start of a new measurement cycle and refilling the syringe pump in case of the device exposed to DI-water.

Another issue with OFETs is the bias stress and device stability over time. Typical double-layer charging capacitor based transistors are sensitive to humidity. Additionally, the large number of ions present in some dielectrics can diffuse into the semiconductor material and result in redox reactions and material degradation. For this purpose e-PVDF-HFP-PTDPPTFT4 devices were analyzed, employing a bias period of 10 minutes at different gate voltages under ambient conditions (FIG. 9A). Previous bias stress analysis in FETs lasting for hours typically reported threshold voltage shifts of at least several volts, even with fluorinated dielectrics. Low-voltage transistors are the most stable regarding threshold voltage shifts but still show shifts of about one volt after 27 h of bias. To obtain information about long-term stress effects in ePVDF-HFP based devices, a bias of $V_D=V_G=-0.5$ V is applied and transfer characteristics are measured before and immediately after each bias step (30 minute duration). This measurement is repeated continuously for over 120 h. The devices exhibited highly stable on ($I_D$) and leakage ($I_G$) currents (FIG. 10B). The threshold voltage shows a small variation of less than ±25 mV and no drift even after 120 h. A similar device placed under DI-water for over 90 h also shows little bias stress, stable $I_D$ and only slight decrease in leakage currents. Additionally, the stability of the e-PVDF-HFP dielectric is tested with devices stored under ambient conditions for more than three months, as well as devices immersed in DI-water for over 24 h, both showing negligible variation in the capacitance values. This is the first example of an OTFT driven under continuous bias with the active material directly exposed to water to exhibit such small variations of $V_{TH}$ and current output. The unexpected device stability with direct exposure to both air and water is directly related to the high ambient and water stability of the e-PVDF-HFP dielectric, as well as the high stability of the PTDPPTFT4 semiconductor. These results indicate that e-PVDF-HFP provides the advantages of typical double-layer charging dielectrics, i.e. low voltage operation and high transconductance, while maintaining an unexpected device stability and low leakage current. This makes it especially useful for applications requiring high current output and sensor applications.

The results demonstrate that the polar rubbery dielectric material e-PVDF-HFP enhances the transconductance of OTFTs at low operating voltages, despite the employed dielectric layer being more than one micron thick. The high OTFT performance is attributed to the formation of an electric double layer in the dielectric material, a phenomenon rarely observed in polymer dielectrics at low ion concentrations. The results also show that there is significant influence of electric double-layer charging on OTFT transfer characteristics, even at an extremely low ion conductivity ($8 \times 10^{-11}$ S/cm), a value that is several orders of magnitude lower than conventional polymer electrolytes ($10^{-4}$-$10^{-5}$ S/cm) or ion liquids/gels ($10^{-2}$-$10^{-4}$ S/cm). The combination of the high polarity and low $T_g$ of the elastic fluoro-polymer results in a double-layer capacitor effect, thus leading to the high transconductance observed in the devices. This dielectric material is applicable to a variety of semiconducting materials beyond organic semiconductors. Due to its low cost, compatibility with standard manufacturing techniques, low driving voltage and high stability in air and aqueous media, polar rubbery polymer dielectrics are suitable for practical applications such as biomedical devices, sensors, wearable electronics and stretchable devices.

Polymer semiconductors, P3HT (from Aldrich), PTD-PPTFT4 (provided by Corning Incorporated) and PCBM (from Sigma-Aldrich) are used as received without further purification. PII2T is synthesized according to previously reported procedures. e-PVDF-HFP is purchased from 3M Co. (3M™ Dyneon™ Fluoroelastomer FE). It (1.2 g) is dissolved in 10 mL anhydrous 2-butone by stirring overnight under an inert atmosphere. The obtained solution is filtered through a 0.2 μm PTFE filter and spin-coated onto a highly doped n-type Si (100) (<0.004 Ωcm) substrate at 1500 rpm for 1 min. The films are then dried at 80° C. for 10 min and subsequently cross-linked at 180° C. for 6 hours.

The semiconducting polymers and PCBM are spin-coated on top of the fluoroelastomer from chlorobenzene (P3HT, 5 mg/mL), dichlorobenzene (PII2T, 5 mg/mL), chlorobenzene (PTDPPTFT4, 5 mg/mL) and chloroform (PCBM, 10 mg/mL), respectively, at 1000 rpm for 1 min. The semiconducting polymers are then annealed for 1 h at 120° C. under an inert atmosphere to remove any residual solvent. The monolayer graphene films are grown on Cu foil using chemical vapor deposition. Sequentially, the CVD-grown graphene sheets are transferred onto the e-PVDF-HFP/Si substrate for device fabrication. Gold source-drain contacts are then evaporated through a shadow mask on top of the semiconducting thin films (top contact).

The TFT transfer and output characteristics are recorded in a $N_2$-filled glove box or in air by using a Keithley 4200 semiconductor parametric analyzer (Keithley Instruments, Cleveland, Ohio). The capacitances of the dielectric materials are measured using an Agilent E4980A Precision LCR Meter and a Biologic VMP3 electrochemistry workstation. The Quasi-DC capacitance measurements based on charging/discharging of RC circuits are carried out adding an external resistor, applying a Keithley model 2400 as voltage source and a Keithley model 2635A as voltmeter.

Optical micrographs are recorded with a cross-polarized optical microscope (Leica DM4000M). Thickness measurements are performed on a Dektak 150 profilometer (Veeco Metrology Group). Tapping mode atomic force microscopy is performed using a Multimode Nanoscope III (Digital Instruments/Veeco Metrology Group). Differential scanning calorimetry is measured on a TA Instruments Q2000. Grazing incidence X-ray diffraction (GIXD) experiments are performed at the Stanford Synchrotron Radiation Lightsource (SSRL) on beamline 11-3 with a photon energy of 12.7 keV. A 2D image plate (MAR345) is used to detect the diffracted X-rays. The detector is 400 mm from the sample center. The angle of incidence is kept at 0.08 degrees, slightly below the critical angle corresponding to total reflectance to reduce the scattering background from the amorphous dielectric beneath the active layer. At an incident angle of 0.12 degrees, the diffraction peaks of the active layer are drown by the background scattering, whereas at incident angles below 0.08 degrees, the signal from the active layer becomes weaker. The exposure time is 6 min. The GIXD data is analyzed using the wxDiff software.

Although the foregoing refers to particular embodiments, it will be understood that the invention is not so limited. Those of ordinary skill in the art will understand that various modifications may be made to the disclosed embodiments and that such modifications are intended to be within the scope of the invention. All of the publications, patent applications and patents cited herein are incorporated herein by reference in their entirety.

What is claimed is:

1. An organic thin film transistor comprising:
   a first gate;
   a second gate;
   a semiconducting layer located between the first gate and second gate and configured to operate as a channel;

a source electrode and a drain electrode connected to opposing sides of the semiconductor layer;

a first dielectric layer located between the first gate and the semiconducting layer in a direction of current flow through the semiconductor layer, the first dielectric layer comprising a polar elastomeric dielectric material that exhibits a double layer charging effect when a set voltage is applied to the first gate; and a second dielectric layer located between the second gate and the semiconducting layer.

2. The organic thin film transistor of claim 1, wherein the set voltage is configured to induce free carriers in the semiconductor layer, and wherein the free carriers increase a switching speed of the organic thin film transistor.

3. The organic thin film transistor of claim 1, wherein the organic thin film transistor has a coplanar configuration or a staggered configuration.

4. The organic thin film transistor of claim 1, wherein the organic thin film transistor has a top gate or a bottom gate configuration.

5. The organic thin film transistor of claim 1, wherein a length of the first gate is the same as the length of the second gate, taken in a direction of current flow between the source and drain electrodes.

6. The organic thin film transistor of claim 1, wherein when a set voltage is applied to the first gate in a direction of current flow through the semiconductor layer, free carriers are generated in the semiconductor layer.

7. The organic thin film transistor of claim 1, further comprising a third gate disposed on the same side of the semiconductor layer as the first gate and electrically connected to the second gate.

8. The organic thin film transistor of claim 7, wherein the first gate is longer than the third gate, in a direction of current flow between the source and drain electrodes.

9. The organic thin film transistor of claim 7, wherein the first and second gates are offset from one another, such that an offset region of the semiconductor layer is overlapped by the second gate and is not overlapped by the first gate, and where optionally, the offset region is located closer to the drain electrode than the source electrode.

10. The organic thin film transistor of claim 7, wherein a thickness of the first dielectric layer ranges from about 100 nm to about 1 μm.

11. The organic thin film transistor of claim 7, wherein the second dielectric layer comprises a different material from the first dielectric layer.

12. A method of operating the organic thin film transistor of claim 1, the method comprising:

applying a set voltage to the first gate to induce the formation of free carriers in the first dielectric layer; and applying a signal voltage to the second gate, such that current flows through the semiconductor layer.

13. The method of claim 12, wherein the set voltage creates a first electric field at an interface between the polymer dielectric layer and the semiconducting layer, and a second electric field at an interface between the polymer dielectric layer and the first gate.

14. The method of claim 12, further comprising applying an overdrive voltage to the first and second gates to create a current pinch off region in the semiconducting layer.

15. The method of claim 12, wherein the set voltage ranges from about 1 to about 3 volts, the signal voltage ranges from about 0 to about 3 volts, and the set voltage is turned off when a signal voltage frequency is longer than a response time of the first dielectric layer.

16. The method of claim 12, wherein the first and second gates are offset from one another, such that an offset region of the semiconductor layer is overlapped by the second gate and is not overlapped by the first gate.

17. The method of claim 12, wherein the organic thin film transistor further comprises a third gate, the third gate electrically connected to the second gate and the method further comprises applying the signal voltage to the second and third gates.

18. A method of making an organic thin film transistor comprising:

forming a first gate on a substrate;

forming a first dielectric layer on the first gate;

forming a semiconducting layer configured to operate as a channel on the first dielectric layer;

forming a second dielectric layer on the semiconducting layer;

forming a second gate on the second dielectric layer, wherein, one of the first and second dielectric layers comprises a polar elastomeric dielectric material, and the first and second gates are configured to receive different ones of a set current and a gate current.

19. The method of claim 18, wherein the first and second gates have substantially the same length in a direction of current flow through the semiconductor layer.

20. The method of claim 18, wherein in the second gate is longer than the first gate, in a direction of current flow through the semiconductor layer.

* * * * *

UNITED STATES PATENT AND TRADEMARK OFFICE
CERTIFICATE OF CORRECTION

PATENT NO. : 10,026,911 B2  
APPLICATION NO. : 15/404714  
DATED : July 17, 2018  
INVENTOR(S) : Darwin Gene Enicks et al.

Page 1 of 1

It is certified that error appears in the above-identified patent and that said Letters Patent is hereby corrected as shown below:

On the Title Page

On page 2, Column 2, item (56), other publications, Line 1, delete "All-Plymer" and insert -- All-Polymer --, therefor.

On page 2, Column 2, item (56), other publications, Line 7, delete "in draf." and insert -- in draft. --, therefor.

In the Claims

Column 16, Line 46, Claim 20, delete "wherein in" and insert -- wherein --, therefor.

Signed and Sealed this  
Fifteenth Day of March, 2022

Drew Hirshfeld  
*Performing the Functions and Duties of the*  
*Under Secretary of Commerce for Intellectual Property and*  
*Director of the United States Patent and Trademark Office*